United States Patent
Ishii

(10) Patent No.: US 8,277,120 B2
(45) Date of Patent: Oct. 2, 2012

(54) SEMICONDUCTOR INTEGRATED CIRCUIT

(75) Inventor: Chihiro Ishii, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 467 days.

(21) Appl. No.: 12/685,068

(22) Filed: Jan. 11, 2010

(65) Prior Publication Data

US 2010/0253416 A1 Oct. 7, 2010

(30) Foreign Application Priority Data

Apr. 1, 2009 (JP) .................................. 2009-089367

(51) Int. Cl.
*G01K 7/16* (2006.01)
(52) U.S. Cl. .......................... 374/179; 374/185; 374/170
(58) Field of Classification Search .................. 374/178, 374/179, 173, 176, 185, 183, 163, 141, 100
See application file for complete search history.

(56) References Cited

U.S. PATENT DOCUMENTS

| | | | | |
|---|---|---|---|---|
| 5,835,553 A * | 11/1998 | Suzuki | ...................... | 374/E1.002 |
| 6,783,274 B2 * | 8/2004 | Umeyama et al. | ............ | 374/178 |
| 6,841,843 B2 * | 1/2005 | Ohkubo et al. | .......... | 374/E7.035 |
| 6,888,397 B2 * | 5/2005 | Tsuchiya | ....................... | 374/170 |
| 7,093,975 B2 * | 8/2006 | Sengoku et al. | .............. | 374/170 |
| 7,107,178 B2 * | 9/2006 | Won et al. | ................ | 374/E3.002 |
| 7,149,644 B2 * | 12/2006 | Kobayashi et al. | ...... | 374/E7.001 |
| 7,276,891 B2 * | 10/2007 | Watanabe et al. | ........ | 374/E7.035 |
| 7,392,152 B2 * | 6/2008 | Inukai et al. | ........... | 374/E15.002 |
| 7,446,581 B2 * | 11/2008 | Ishii et al. | ....................... | 327/210 |
| 7,703,975 B2 * | 4/2010 | Kim | ............................... | 374/170 |
| 7,759,995 B2 * | 7/2010 | Ishii et al. | ...................... | 327/214 |
| 8,033,720 B2 * | 10/2011 | Chu | ............................... | 374/178 |
| 8,083,404 B2 * | 12/2011 | Shoda | ........................... | 374/170 |
| 2004/0188795 A1 * | 9/2004 | Ohkubo et al. | ............... | 257/467 |
| 2005/0074051 A1 * | 4/2005 | Won et al. | ...................... | 374/170 |
| 2005/0093618 A1 * | 5/2005 | Kobayashi et al. | ........... | 327/538 |
| 2005/0146964 A1 * | 7/2005 | Sako | ............................. | 365/211 |
| 2005/0264971 A1 * | 12/2005 | Morino | ........................ | 361/103 |
| 2006/0082404 A1 * | 4/2006 | Ishii et al. | ...................... | 327/208 |
| 2006/0103449 A1 * | 5/2006 | Watanabe et al. | .......... | 327/512 |
| 2006/0224351 A1 * | 10/2006 | Inukai et al. | .................. | 702/132 |
| 2006/0289461 A1 * | 12/2006 | Kojima et al. | ................ | 219/497 |
| 2007/0043522 A1 * | 2/2007 | Kobayashi et al. | ............. | 702/57 |
| 2007/0203664 A1 * | 8/2007 | Ishikawa | ....................... | 374/141 |
| 2008/0036525 A1 * | 2/2008 | Kim | ................................ | 327/512 |
| 2008/0059110 A1 * | 3/2008 | Fujisawa et al. | .............. | 702/130 |
| 2008/0162067 A1 * | 7/2008 | Inukai et al. | .................... | 702/99 |
| 2008/0252360 A1 * | 10/2008 | Yoshikawa | ..................... | 327/512 |
| 2008/0259990 A1 * | 10/2008 | Takeuchi | .......................... | 374/1 |

(Continued)

FOREIGN PATENT DOCUMENTS

JP 08-078612 3/1996

(Continued)

*Primary Examiner* — Yaritza Guadalupe-McCall
(74) *Attorney, Agent, or Firm* — Turocy & Watson, LLP

(57) ABSTRACT

A semiconductor integrated circuit includes a delay characteristic compensating circuit that is provided in a logic area including an inside and a surface of a chip. The delay characteristic compensating circuit includes a heat generating circuit that heats the semiconductor integrated circuit, a temperature sensor that measures a junction temperature, a voltage monitor that measures a power supply voltage, and a control circuit that actuates the heat generating circuit when the junction temperature does not reach a reference temperature and when the power supply voltage is lower than a reference voltage and stops actuating the heat generating circuit when the junction temperature reaches the reference temperature.

18 Claims, 7 Drawing Sheets

U.S. PATENT DOCUMENTS

| | | | |
|---|---|---|---|
| 2008/0291969 A1* | 11/2008 | Chu | 374/178 |
| 2009/0039937 A1* | 2/2009 | Ishii et al. | 327/210 |
| 2009/0059999 A1* | 3/2009 | Shoda | 374/185 |
| 2010/0142587 A1* | 6/2010 | Kajita | 374/183 |
| 2010/0253416 A1* | 10/2010 | Ishii | 327/513 |
| 2011/0101349 A1* | 5/2011 | Oda | 374/44 |
| 2012/0063247 A1* | 3/2012 | Chu | 374/163 |

FOREIGN PATENT DOCUMENTS

JP    2007-258216    10/2007

* cited by examiner

SEMICONDUCTOR INTEGRATED CIRCUIT

CROSS-REFERENCE TO RELATED APPLICATIONS

This application is based upon and claims the benefit of priority from the prior Japanese Patent Application No. 2009-089367, filed on Apr. 1, 2009; the entire contents of which are incorporated herein by reference.

BACKGROUND OF THE INVENTION

1. Field of the Invention

The present invention relates to a semiconductor integrated circuit.

2. Description of the Related Art

When a semiconductor integrated circuit operates at a low voltage and low temperature, a delay characteristic extremely becomes large as compared to at room temperature. This phenomenon is referred to as low temperature worst, and conspicuously occurs along with the miniaturization of a semiconductor integrated circuit and the voltage lowering of a power supply voltage. Low temperature worst is a completely opposite characteristic to a well-known phenomenon saying that "a delay characteristic at a low-temperature operation becomes small as compared to room temperature". This means that the concept of conventional common-sense high temperature worst is not in currency.

To guarantee the operation of a semiconductor integrated circuit, a timing design is performed on a maximum delay characteristic and a minimum delay characteristic. The delay characteristic of the semiconductor integrated circuit becomes large at a low voltage and becomes small at a high voltage. Therefore, in a conventional design in which the concept of high temperature worst is in currency, a timing design for a maximum delay characteristic is performed at a low voltage and high temperature and a timing design for a minimum delay characteristic is performed at a high voltage and low temperature. Additionally, in the design of the low-voltage-operation semiconductor integrated circuit in which low temperature worst occurs as will be noted from simulation, timing verification and operation guarantee of semiconductor integrated circuit are performed by using a delay characteristic at a low voltage and low temperature. Therefore, the operable maximum frequency of the semiconductor integrated circuit is decided by a delay characteristic at a low voltage and low temperature that becomes an extremely large delay characteristic as compared to room temperature.

However, the junction temperature of a transistor constituting a semiconductor integrated circuit speedily rises due to self-heating when an operation starts even in an extreme low temperature environment. In other words, because operation guarantee is conventionally performed for an extremely short time until the junction temperature of the semiconductor integrated circuit rises, a timing design is excessively performed.

In the conventional design in which the concept of high temperature worst is in currency, because a timing design at low temperature guarantees the operation of the semiconductor integrated circuit based on a small delay characteristic as compared to room temperature, there is a problem in that a circuit scale is increased by the insertion of a delay circuit and a design turn-around time is increased by the difficulty of design.

Additionally, in the design of the low-voltage-operation semiconductor integrated circuit in which low temperature worst occurs, because an operation is guaranteed at a maximum frequency due to an extremely large delay characteristic as compared to room temperature, there is a problem such as the increase of circuit scale caused by the use of a large driving-force cell, the increase of leakage currents caused by using a low circuit-threshold cell, or the increase of design turn-around time caused by the difficulty of design.

Semiconductor integrated circuits that solve the problem are disclosed in, for example, Japanese Patent Application Laid-open No. H8-78612 and Japanese Patent Application Laid-open No. 2007-258216. The semiconductor integrated circuits disclosed in these documents actuates a heat generating circuit when the temperature of the semiconductor integrated circuit is lower than the reference temperature and raises the temperature of the semiconductor integrated circuit in order to guarantee a normal operation at a low-temperature operation.

In other words, the semiconductor integrated circuit disclosed in Japanese Patent Application Laid-open No. H8-78612 (FIG. 1) utilizes a ring oscillator as a heat generating circuit, utilizes a resistor that has a positive temperature coefficient and a resistor that does not have a temperature coefficient for the detection of temperature, enables the control of the heat generating circuit by temperature by comparing voltage variation by the resistor with a reference voltage by using a comparator, and controls the temperature of the semiconductor integrated circuit to a predetermined temperature.

However, in the semiconductor integrated circuit disclosed in Japanese Patent Application Laid-open No. H8-78612, the heat generating circuit is activated when the temperature of the semiconductor integrated circuit is lower than the set reference temperature irrespective of the following voltages at the high voltage at which the concept "a delay characteristic at a low-temperature operation becomes small as compared to room temperature" of high temperature worst is in currency and at the low voltage at which low temperature worst "a delay characteristic at a low-temperature operation becomes large as compared to room temperature" occurs. Therefore, the expected effect is not obtained at a low or high voltage and thus a normal operation cannot be guaranteed.

Moreover, Japanese Patent Application Laid-open No. H8-78612 discloses that a heat generating circuit is arranged on the surface of chip and is not incorporated into the chip. In this way, such a configuration shows an effect that a cost is reduced or an effect that incorporating technology into chip is not necessary. However, because the configuration needs a cost for incorporating a plurality of chips into one package, it is valid to incorporate the same chip from a cost standpoint. A system LSI that incorporates various functions of chips into one chip is today a general technology. A technology for incorporating various functions into a chip is not difficult.

If a method for incorporating a heat generating circuit into a chip is employed, there is a merit such as arranging a heat generating circuit in a range in which a delay characteristic at a low voltage and low temperature has a problem, arranging a heat generating circuit near a place at which a problem particularly occurs, or temporarily utilizing an existing circuit inside a chip as a heat generating circuit. When temporarily utilizing an existing circuit as a heat generating circuit, there is a merit from the viewpoint of square measure because the heat generating circuit is not appended. When arranging a heat generating circuit inside a chip, it is difficult to utilize such a fine arrangement and an existing circuit inside the chip.

Next, the semiconductor integrated circuit disclosed in Japanese Patent Application Laid-open No. 2007-258216 (FIG. 1) utilizes a loop circuit such as a Peltier element, a memory circuit, or an inverter as a heat generating circuit, utilizes the oscillating frequency of a ring oscillator for temperature detection, controls the heat generating circuit by comparison with reference frequency performed by a frequency comparator, in order to controls the temperature of the semiconductor integrated circuit to a predetermined temperature.

However, Japanese Patent Application Laid-open No. 2007-258216 definitely describes that a configuration, which performs the control of temperature by using a measurement value such as the oscillating frequency of a ring oscillator that is decreased in accordance with the rise of temperature, assumes the concept of high temperature worst that "a delay characteristic at a low-temperature operation becomes small as compared to room temperature". Therefore, it is clear to guarantee the operation of the semiconductor integrated circuit by using a small delay characteristic as compared to room temperature.

In addition, in the technology disclosed in Japanese Patent Application Laid-open No. 2007-258216, because a measurement value such as the oscillating frequency of a ring oscillator further becomes large as compared to low temperature even if the temperature of the semiconductor integrated circuit rises in the heat generating circuit of which the operation starts at low temperature in the case of a low voltage at which low temperature worst seems to occur, the operation cannot be stopped even if the temperature of the semiconductor integrated circuit reaches a predetermined temperature. Therefore, it is not possible to guarantee a normal operation at a low-temperature operation. Moreover, because the control of the heat generating circuit by voltage is not performed in addition to the control of the heat generating circuit caused by temperature, it is not possible to avoid the generation of such a trouble at a low voltage at which low temperature worst seems to occur.

SUMMARY OF THE INVENTION

According to one aspect of the present invention, a semiconductor integrated circuit includes a delay characteristic compensating circuit that is provided in a logic area including an inside and a surface of a chip, and includes a heat generating circuit that generates heat by using a self operation to heat the semiconductor integrated circuit, a temperature sensor that measures a junction temperature, a voltage monitor that measures a power supply voltage, and a control circuit that determines whether the junction temperature reaches a reference temperature and whether the power supply voltage is lower than a reference voltage on the basis of signals output from the temperature sensor and the voltage monitor, does not actuate the heat generating circuit when the power supply voltage is higher than the reference voltage, actuates the heat generating circuit when the junction temperature does not reach the reference temperature and when the power supply voltage is lower than the reference voltage, and stops actuating the heat generating circuit when the junction temperature reaches the reference temperature.

DETAILED DESCRIPTION OF THE INVENTION

Figure 1:
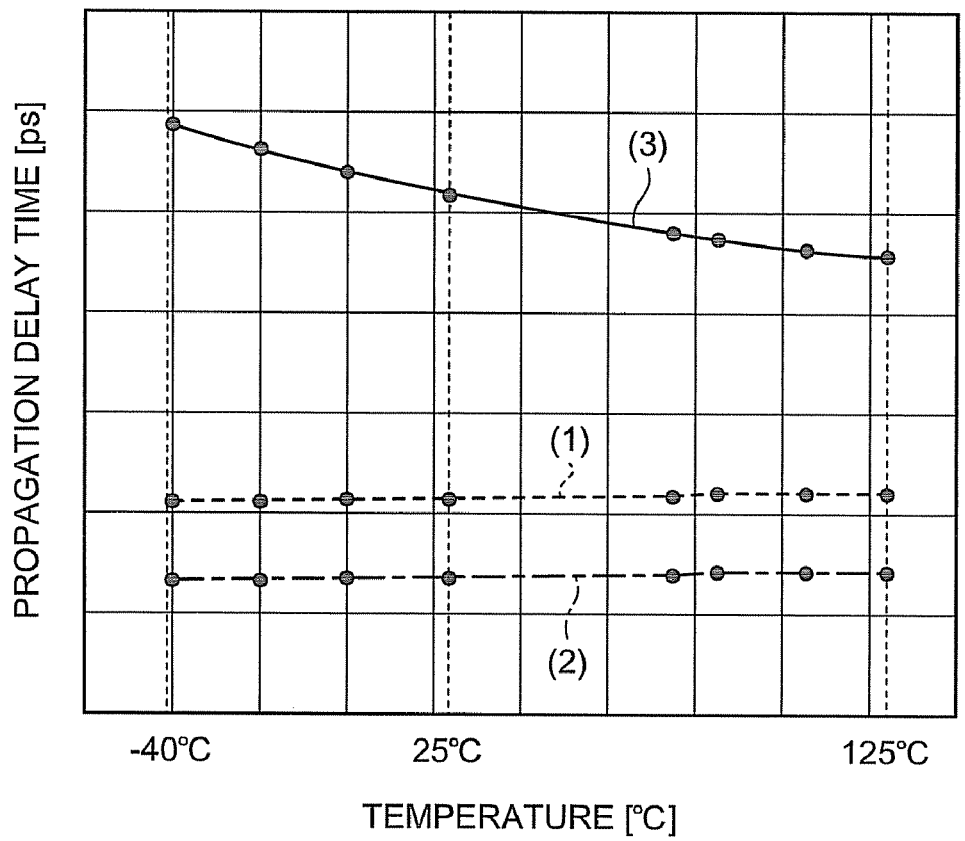
FIG. 1 is a characteristic diagram explaining a temperature dependency characteristic and a voltage dependence characteristic of a delay characteristic in a semiconductor integrated circuit.
Figure 2:
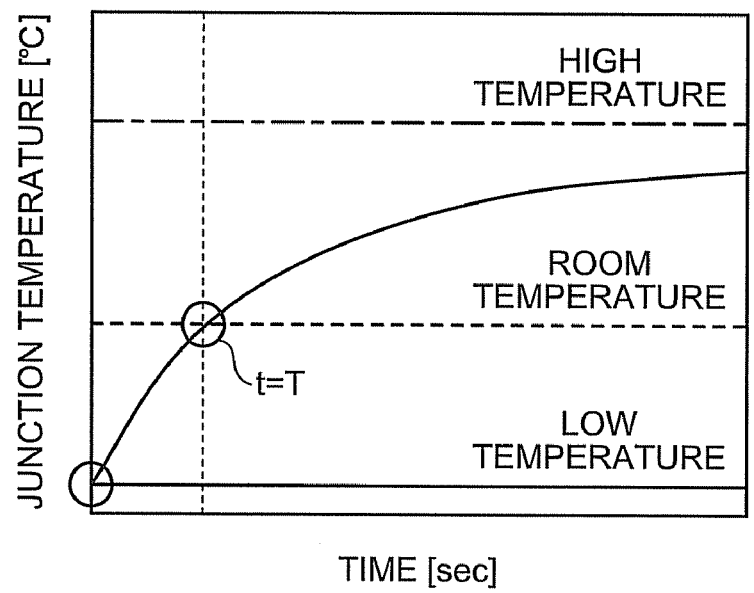
FIG. 2 is a conceptual diagram explaining a state in which the junction temperature of the semiconductor integrated circuit rises.

First, to make the comprehension of the present invention easy, it will be explained about a delay characteristic in a semiconductor integrated circuit and temperature rise of the semiconductor integrated circuit caused by the rise of junction temperature with reference to FIGS. 1 and 2. FIG. 1 is a characteristic diagram explaining a temperature dependency characteristic and a voltage dependence characteristic of a delay characteristic in the semiconductor integrated circuit. FIG. 2 is a conceptual diagram explaining a state in which the junction temperature of the semiconductor integrated circuit rises.

In FIG. 1, a horizontal axis is the junction temperature (−40° C. to +125° C.) of the semiconductor integrated circuit and a vertical axis is a propagation delay time [ps]. As to a power supply voltage supplied to the semiconductor integrated circuit, an operating voltage range (a reference voltage, a high voltage, and a low voltage) in which a normal logic operation of the semiconductor integrated circuit is guaranteed is defined. Therefore, the delay characteristic of the semiconductor integrated circuit is defined in the case where a power supply voltage is a reference voltage, the case where a power supply voltage is a high voltage, and the case where a power supply voltage is a low voltage. Moreover, the operating voltage range is defined in the case of a standard operation and a low-voltage operation. For example, as to the operating voltage range, in the case of a standard operation, a reference voltage is 1.2V, a high voltage is 1.3V, and a low voltage is 1.1V. In the case of a low-voltage operation, a reference voltage is 1.0V, a high voltage is 1.1V, and a low voltage is 0.9V. The power supply voltages are voltages that are supplied to the semiconductor integrated circuit. Inside the semiconductor integrated circuit, a power supply voltage further decreases due to wiring resistance and current consumption on the current supply path of a power supply. However, an amount of voltage reduction is different inside the semiconductor integrated circuit due to the size of local wiring resistance and current consumption. In FIG. 1, three delay characteristics (1), (2), and (3) in which power supply voltages are different are illustrated.

In FIG. 1, the delay characteristic (1) is a delay characteristic when a power supply voltage is 1.0V. In this case, a delay time indicates a tendency that a time becomes slow with a slightly right-upward slant and shows a substantially constant change within the range of the junction temperature (−40° C. to +125° C.). Moreover, the delay characteristic (2) indicating a delay time shorter than the delay characteristic (1) is a delay characteristic when a power supply voltage is 1.2V. In this case, a delay time indicates a tendency that a time becomes slightly large when the junction temperature exceeds 25° C. and does not become larger than the delay characteristic (1). On the other hand, the delay characteristic (3) indicating a delay time largely delayed compared to the delay characteristic (1) is a delay characteristic when a power supply voltage is 0.8V. In this case, the closer the temperature becomes a low temperature, the more a delay time becomes large. A phenomenon shown in the delay characteristics (3) is low temperature worst.

In FIG. 2, a horizontal axis is a time [sec] and a vertical axis is a junction temperature [° C.]. As illustrated in FIG. 2, a transistor constituting the semiconductor integrated circuit indicates a characteristic that junction temperature speedily rises from low temperature due to self-heating, arrives at room temperature within short time t=T, and furthermore rises toward high temperature when a power supply is turned on and an operation starts even if a junction temperature is low temperature such as −40° C.

Hereinafter, it will be in detail explained about the semiconductor integrated circuit according to an embodiment of the present invention with reference to the accompanying drawings. However, the present invention is not limited to these embodiments.

Figure 3:
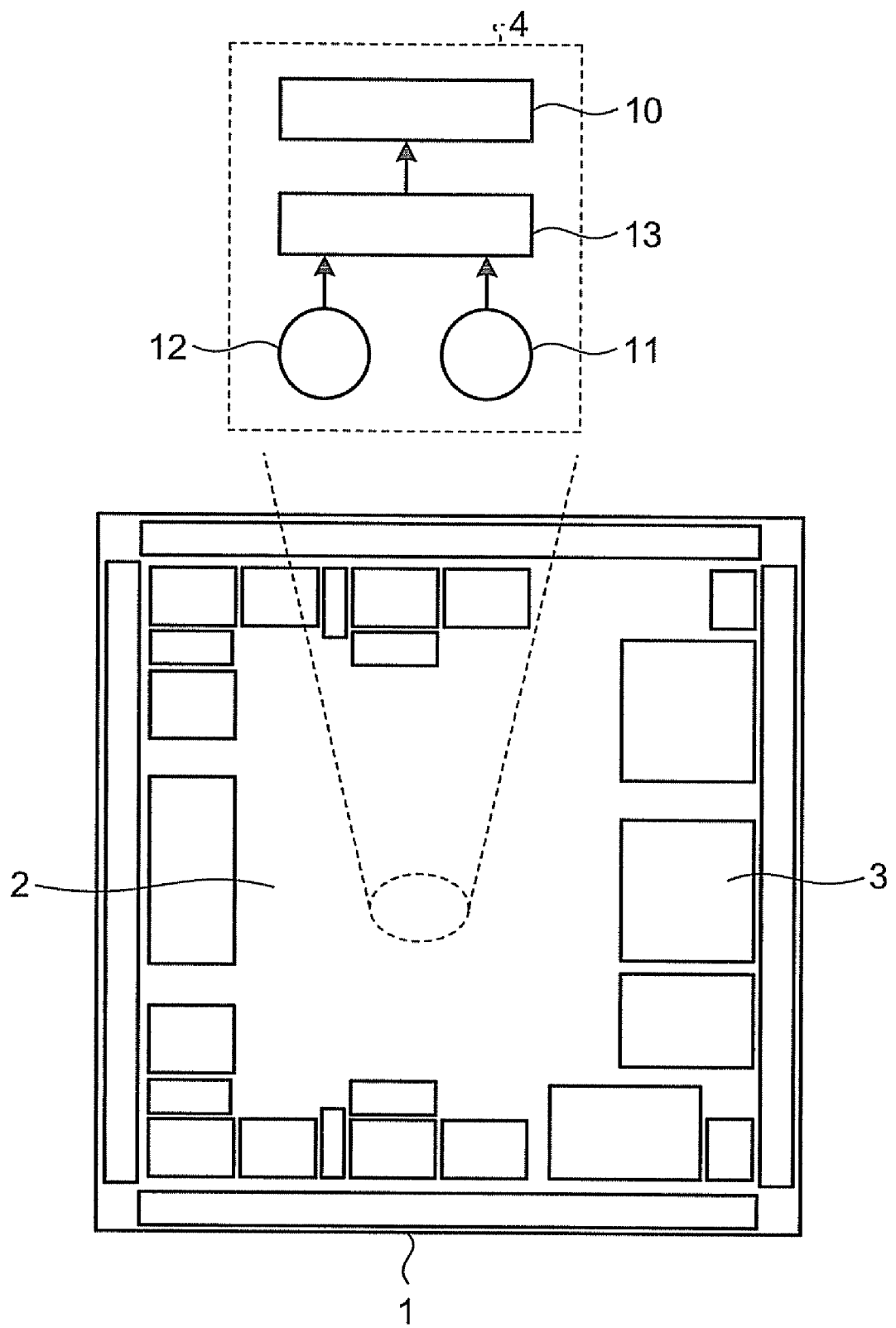
FIG. 3 is a block diagram illustrating the configuration of a delay characteristic compensating circuit according to the present invention and a plan view illustrating the layout of the semiconductor integrated circuit that incorporates the delay characteristic compensating circuit as a first embodiment of the present invention.

FIG. 3 is a block diagram illustrating the configuration of a delay characteristic compensating circuit 4 according to the present invention and a plan view illustrating the layout of a semiconductor integrated circuit 1 that incorporates the delay characteristic compensating circuit 4 as a first embodiment of the present invention.

In FIG. 3, the semiconductor integrated circuit 1 is designed to include a logic area 2 in which a logic circuit to be designed is formed and an IP area 3 in which an IP (IP is generally intellectual property but is a reusable circuit that verification is completed in this case) such as a memory or an ADC not to be designed is arranged. In FIG. 3, to make the comprehension of the present invention easy, it is assumed that the logic area 2 is surrounded by the IP area 3. The delay characteristic compensating circuit 4 according to the present invention is provided in the logic area 2 that includes the surface and inside of the semiconductor integrated circuit 1 chip.

The delay characteristic compensating circuit 4 includes a heat generating circuit 10, a temperature sensor 11, a voltage monitor 12, and a control circuit 13. When receiving an operation start instruction from the control circuit 13, the heat generating circuit 10 performs a self operation to generate heat and heats the semiconductor integrated circuit 1 around its arrangement place until an operation stop instruction is received. When the semiconductor integrated circuit 1 starts an operation, the temperature sensor 11 measures a junction temperature that rises as illustrated in FIG. 2 and outputs its result to the control circuit 13. The voltage monitor 12 measures a power supply voltage at a place at which the voltage monitor is arranged and outputs the measured voltage to the control circuit 13.

The control circuit 13 determines whether the junction temperature reach a reference temperature and whether the power supply voltage is lower than a reference voltage on the basis of the signals output from the temperature sensor 11 and the voltage monitor 12. When the power supply voltage is higher than the reference voltage, the control circuit 13 does not actuate the heat generating circuit 10. When the junction temperature does not reach the reference temperature and the power supply voltage is lower than the reference voltage, the control circuit 13 actuates the heat generating circuit 10. When the junction temperature arrives at the reference temperature, the control circuit 13 stops the operation of the heat generating circuit 10.

In this way, the semiconductor integrated circuit can compensate for a delay characteristic at only a low voltage and low temperature operation. Therefore, it is possible to realize the semiconductor integrated circuit that can avoid a trouble performing compensation opposite to expectation at a high voltage in which a temperature characteristic for a delay becomes opposite.

Hereinafter, it will be explained about a configuration example of each element of the delay characteristic compensating circuit 4 and an arrangement example of the delay characteristic compensating circuit 4 as an embodiment.

Figure 4:
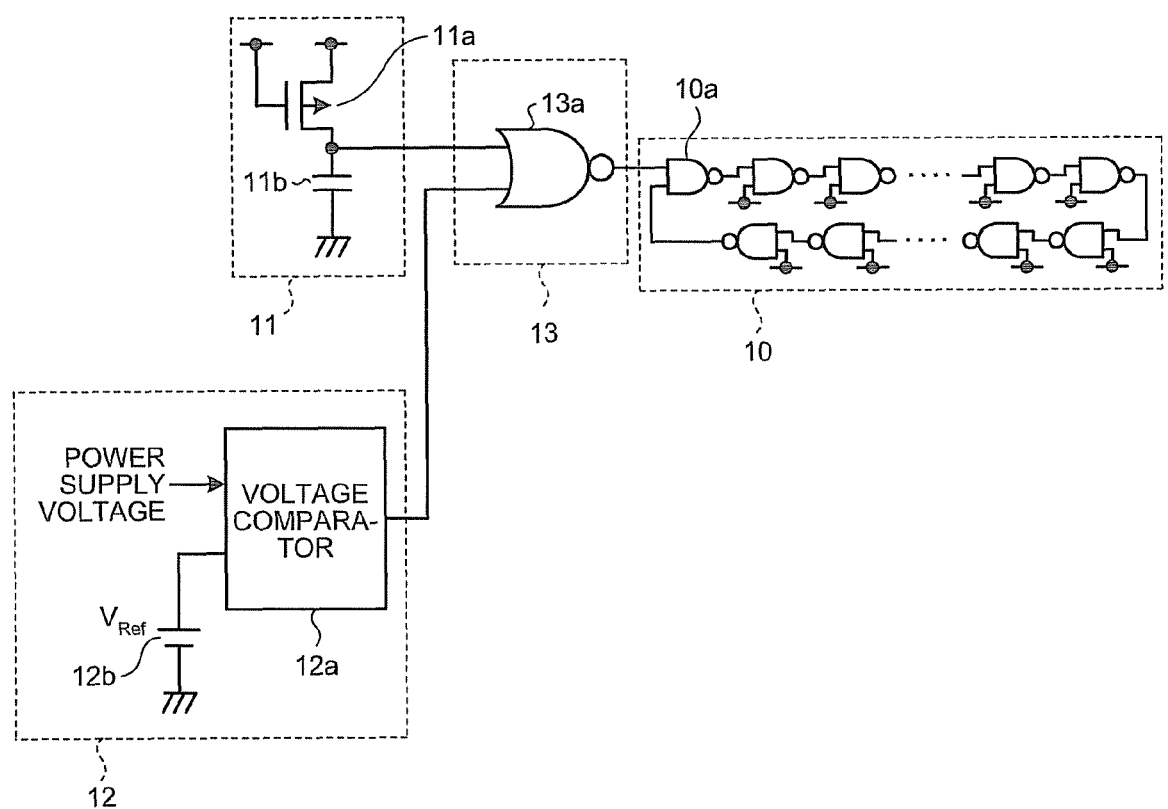
FIG. 4 is a circuit diagram illustrating a configuration example (1) of the delay characteristic compensating circuit illustrated in FIG. 3 as a second embodiment of the present invention.

FIG. 4 is a circuit diagram illustrating a configuration example (1) of the delay characteristic compensating circuit 4 illustrated in FIG. 3 as a second embodiment of the present invention. In FIG. 4, the control circuit 13 illustrated in FIG. 3 can be configured with, for example, a two-input NOR gate 13a. The output of the temperature sensor 11 is input into one input terminal of the NOR gate 13a and the output of the voltage monitor 12 is input into the other input terminal. The output terminal of the NOR gate 13a is connected to a control port of the heat generating circuit 10.

The heat generating circuit 10 illustrated in FIG. 3 can be configured with, for example, a ring oscillator that is made by connecting a plurality of two-input NAND gates in the shape of ring. Among the plurality of two-input NAND gates, one input terminal of one two-input NAND gate 10a is the control port and the output of the control circuit 13 is input into the one input terminal. The output of the preceding-stage two-input NAND gate is input into the other input terminal. In the remaining two-input NAND gates, one input terminal is connected to the output of the preceding-stage two-input NAND gate and the other input terminal is connected to a power supply.

The heat generating circuit 10 constituted in this way does not operate when the output of the control circuit 13 is a low level (hereinafter, "L" level). However, the heat generating circuit 10 performs a self operation to start an oscillation operation when the output becomes a high level (hereinafter, "H" level) and continues the oscillation operation while the output is an "H" level. During the self operation, the heat generating circuit 10 generates heat and heats the semiconductor integrated circuit 1 around its arrangement place.

The temperature sensor 11 illustrated in FIG. 3 can be configured with, for example, a circuit that is made by serially arranging a transistor 11a and a capacitive element 11b between a power supply and a circuit ground. A series connection end between the transistor 11a and the capacitive element 11b, which acts as an output terminal, is connected to the one input terminal of the NOR gate 13a that is the control circuit 13. The gate of the transistor 11a is connected to the power supply to flow leakage currents in a normal OFF state. The leakage currents are few at a low temperature and increases when a temperature rises. The leakage currents having temperature dependence property in this way are converted into a voltage by the capacitive element 11b and the converted voltage is output to the one input terminal of the NOR gate 13a that is the control circuit 13. In other words, the terminal voltage of the capacitive element 11b corresponds to a junction temperature.

A reference temperature that is a criterion used in the control circuit 13 is a level of a threshold voltage acquired by the NOR gate 13a as an "H" level. In the present embodiment, the reference temperature can be arbitrarily set to a room temperature of about 25° C., a temperature lower or higher than 25° C., and the like by appropriately selecting the capacitance value of the capacitive element 11b.

The voltage monitor 12 illustrated in FIG. 3 can be configured, for example, to compare the size between a reference voltage $V_{Ref}$ of a reference voltage source 12b and a power supply voltage by using a voltage comparator 12a. The output terminal of the voltage comparator 12a is connected to the other input terminal of the NOR gate 13a that is the control circuit 13. The reference voltage $V_{Ref}$ is set to the maximum voltage at which low temperature worst begins to occur. The voltage comparator 12a sets its output to an "L" level when the power supply voltage is lower than the reference voltage $V_{Ref}$ and sets its output to an "H" level when the power supply voltage is higher than the reference voltage $V_{Ref}$.

Next, it will be explained about an operation. When the power supply voltage is higher than the reference voltage $V_{Ref}$, because the output of the voltage monitor 12 is an "H" level, the control circuit 13 outputs an "L" level as its output independently of the output state of the temperature sensor 11. The heat generating circuit 10 does not operate and holds a stopped state.

On the other hand, when the power supply voltage is lower than the reference voltage $V_{Ref}$, the voltage monitor 12 outputs an "L" level. In the situation, at a low temperature at which a junction temperature is considerably lower than a reference temperature, the leakage currents of the transistor 11a of the temperature sensor 11 are few and the terminal voltage of the capacitive element 11b is a level not more than a threshold voltage of the NOR gate 13a. Therefore, the control circuit 13 outputs an "H" level. In this way, the heat generating circuit 10 starts a self operation (oscillation operation) to generate heat and heats the semiconductor integrated circuit 1 around its arrangement place.

When the junction temperature of the transistor constituting the semiconductor integrated circuit 1 rises by using heating caused by the heat generating circuit 10, the leakage currents of the transistor 11a of the temperature sensor 11 increase and the terminal voltage of the capacitive element 11b rises toward the threshold voltage of the NOR gate 13a. When the terminal voltage of the capacitive element 11b exceeds the threshold voltage of the NOR gate 13a, the control circuit 13 outputs an "L" level. In this way, the heat generating circuit 10 stops the self operation (oscillation operation) to stop heating the semiconductor integrated circuit 1.

A rise in temperature caused by the heat generating circuit 10 configured with a ring oscillator at a low voltage and low temperature operation is as follows. In a one-cell two-input NAND gate constituting the ring oscillator, assuming that power consumption is 5 nW/MHz, a delay time is 20 ps, and a load capacitance is 10 fF, the heat generating circuit 10 configured with a 1001-stages ring oscillator performs an oscillation operation at about 50 MHz. At this time, the power consumption of the heat generating circuit 10 becomes 0.87 mW. When the number of the heat generating circuits 10 arranged in a chip is about 1000, the whole power consumption of the heat generating circuits arranged in the chip becomes 0.97 W. Then, assuming that the thermal resistance of a package is 50° C./W and a junction temperature is −40° C., in the case of the whole power consumption 0.97 W of the heat generating circuits arranged in the chip, the difference with the outside air temperature is 48.5° C. and the temperature of the semiconductor integrated circuit 1 rises to 8.5° C.

In addition, there is a problem in that a square measure increases due to the heat generating circuit 10, the temperature sensor 11, and the control circuit 13. However, assuming that the square measure of one cell is 1.1 μm$^2$ and the square measure of load capacitance is 3.6 μm$^2$, the square measure of the heat generating circuit 10 configured with a 1001-stages ring oscillator becomes about 4700 μm$^2$. When the number of the heat generating circuits 10 arranged in a chip is about 1000, its square measure becomes about 0.21 mm$^2$. When the thousand heat generating circuits 10 are arranged in the size of 5 mm square (5 mm×5 mm), the whole square measure of the heat generating circuits is increased by about 0.8%. Therefore, the influence of the increase of square measure is small.

In this case, a low temperature worst phenomenon is particularly easy to occur when the threshold voltage of transistor constituting the semiconductor integrated circuit is high. If the threshold voltage of the transistor becomes high due to the variation of process, the leakage currents in the temperature sensor 11 become smaller. If the characteristic is utilized, the temperature sensor 11 can be utilized as a process variation monitor. In this case, it is possible to detect a state where low temperature worst is easier to occur and actuate the heat generating circuit 10.

Figure 5A:
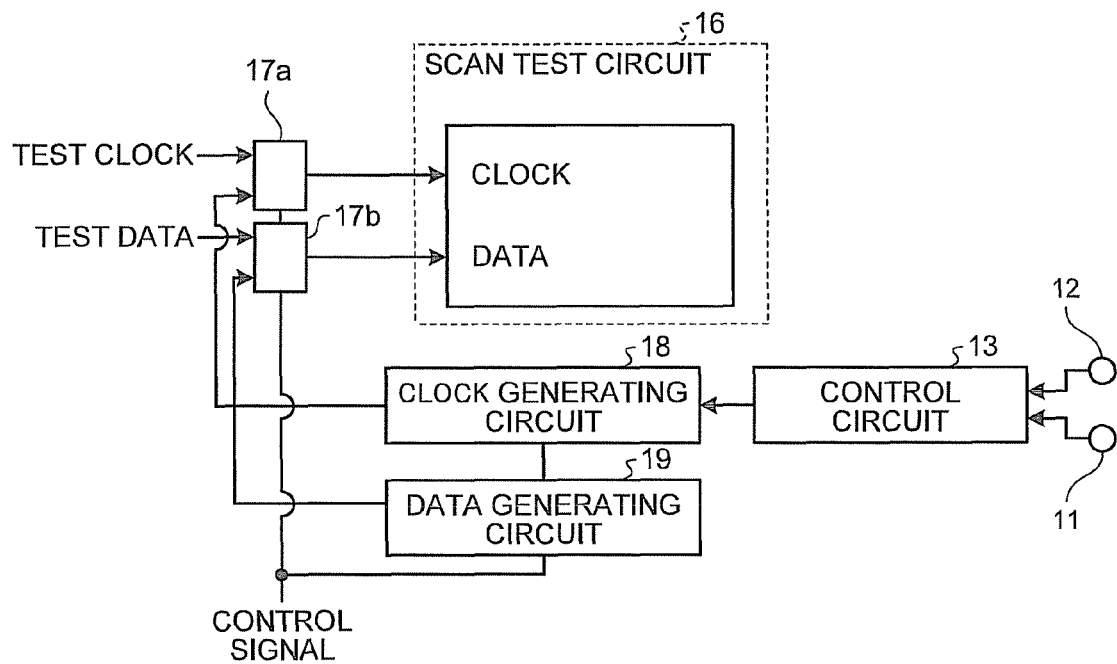
FIGS. 5A to 5C are circuit diagrams illustrating a configuration example (2) of the delay characteristic compensating circuit illustrated in FIG. 3 as a third embodiment of the present invention.
Figure 5B:
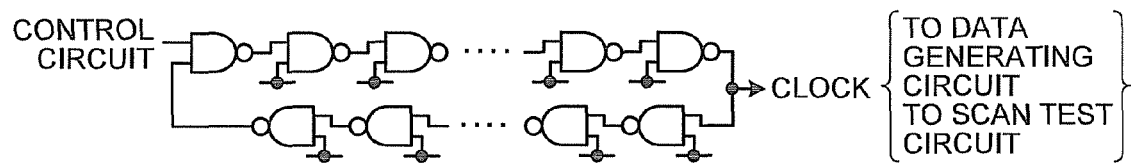
Figure 5C:
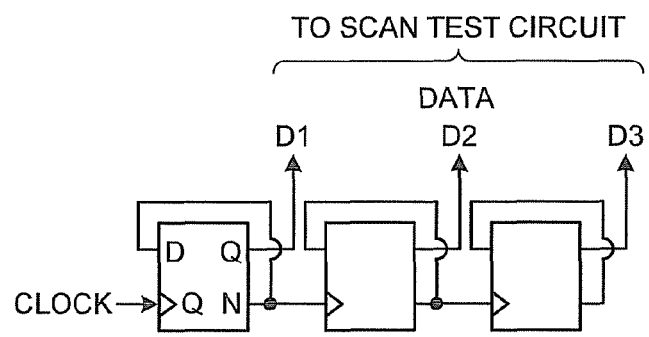

FIGS. 5A to 5C are circuit diagrams illustrating a configuration example (2) of the delay characteristic compensating circuit illustrated in FIG. 3 as a third embodiment of the present invention. As illustrated in FIG. 5A, according to the third embodiment, a SCAN test circuit 16 that is already arranged for failure detection is utilized as the heat generating circuit 10 illustrated in FIG. 3. Therefore, selectors 17a and 17b, a clock generating circuit 18, and a data generating circuit 19 are appended. The temperature sensor 11, the voltage monitor 12, and the control circuit 13 are the components illustrated in FIG. 4.

When a control signal input from the outside indicates "test", the selectors 17a and 17b select a test clock and test data input from the outside and output the clock and data to the SCAN test circuit 16. On the other hand, when a control signal input from the outside indicates "non-test", the selectors 17a and 17b select a clock and data output from the clock generating circuit 18 and the data generating circuit 19 and outputs the clock and data to the SCAN test circuit 16.

For example, illustrated in FIG. 5B, the clock generating circuit 18 is the configuration of the ring oscillator illustrated in FIG. 4. When the output of the control circuit 13 is an "H" level, the clock generating circuit 18 performs an oscillation operation to generate a predetermined-frequency clock. The generated clock is input into the SCAN test circuit 16 via the selector 17a and is also input into the data generating circuit 19.

For example, as illustrated in FIG. 5C, the data generating circuit 19 has a configuration that a plurality of flip-flops (three in FIG. 5C) sequentially perform a data set operation in accordance with the clock output from the clock generating circuit 18 and Q terminals thereof respectively outputs data (D1, D2, and D3). The data (D1, D2, and D3) are input into the SCAN test circuit 16 via the selector 17b.

In addition, the clock generating circuit 18 and the data generating circuit 19 does not operate when the control signals input from the outside respectively indicate "test" and operate in accordance with the instruction of the control circuit 13 that releases operation prohibition when the control signals respectively indicate "non-test".

Next, it will be explained about an operation. When the control signal input from the outside indicates "non-test", the control circuit 13 outputs an "L" level as described in FIG. 4 when the power supply voltage is higher than the reference voltage. Therefore, the clock generating circuit 18 does not operate and thus the data generating circuit 19 also does not operate. The SCAN test circuit 16 stops as before.

On the other hand, in a state where the power supply voltage is lower than the reference voltage, at a low temperature at which a junction temperature is considerably lower than a reference temperature, the control circuit 13 outputs an "H" level as described in FIG. 4. Therefore, the clock generating circuit 18 performs an oscillation operation to output a predetermined-frequency clock and the data generating circuit 19 also outputs the data (D1, D2, and D3). In this way, the SCAN test circuit 16 performs an operation similar to that performed during failure detection to become the heat generating circuit and heats the semiconductor integrated circuit 1 around its arrangement place.

The control circuit 13 outputs an "L" level when the junction temperature exceeds the reference temperature due to the rise of the temperature of the semiconductor integrated circuit 1. Therefore, the clock generating circuit 18 stops the oscillation operation, the data generating circuit 19 also stops the operation, and the SCAN test circuit 16 moves to the previous dormant state.

Because the power consumption of the SCAN test circuit 16 is not less than 1 W, a configuration that the SCAN test circuit 16 is used as the heat generating circuit 10 can expect the same or high rise in temperature compared with the heat generating circuit 10 configured with a ring oscillator.

In this manner, according to the present embodiment, because the delay characteristic compensating circuit 4 illustrated in FIG. 3 can be incorporated into the chip, an existing circuit (for example, the SCAN test circuit) can be temporarily utilized as a heat generating circuit. Therefore, it is not necessary to further append the heat generating circuit 10 and thus there is a merit in terms of square measure. In addition, the heat generating circuit 10 that generates heat by using a self operation can utilize, for example, a resistor in addition to two examples described above.

Figure 6:
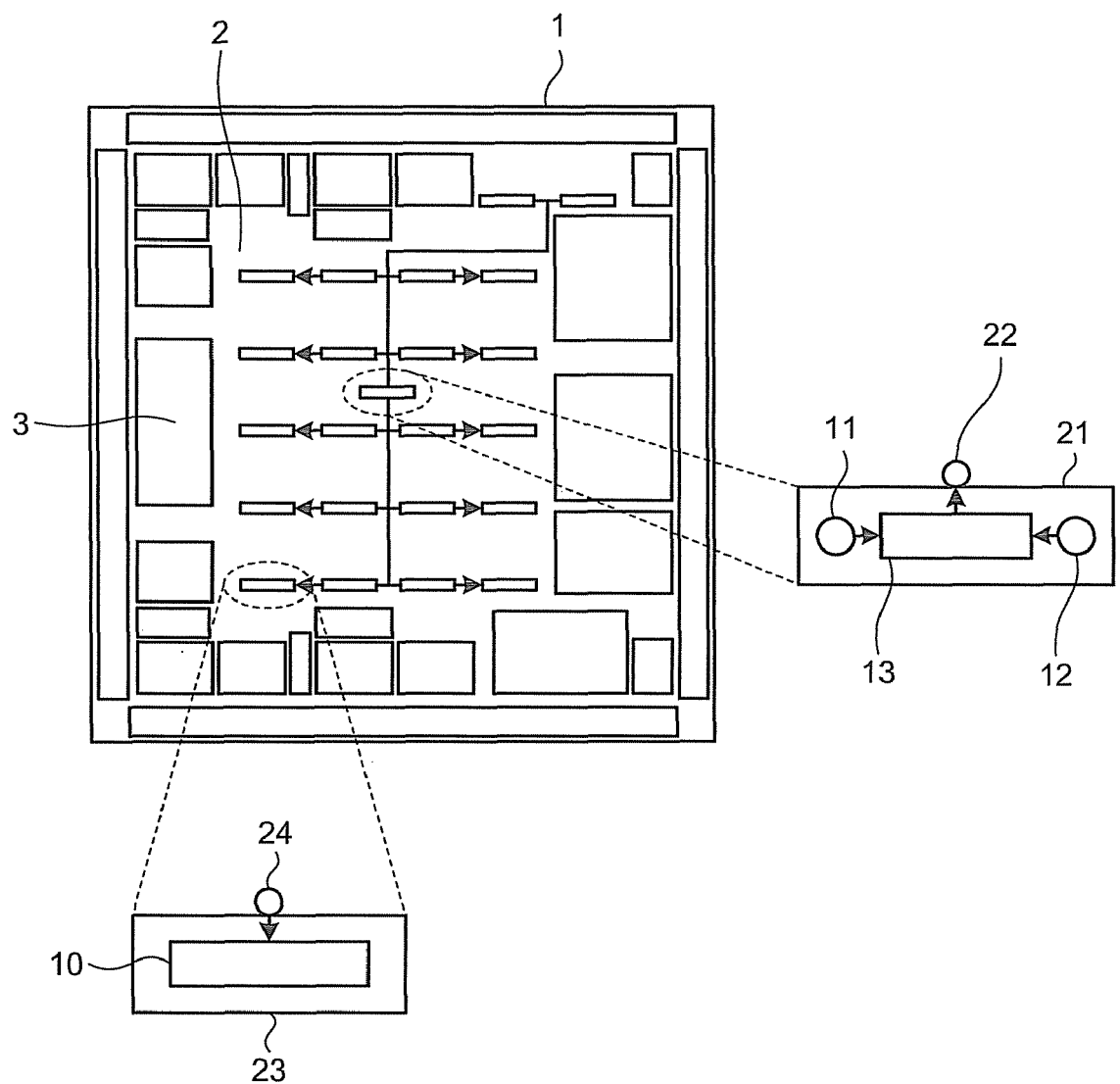
FIG. 6 is a circuit diagram illustrating an arrangement example (1) of the delay characteristic compensating circuit illustrated in FIG. 3 as a fourth embodiment of the present invention.

FIG. 6 is a circuit diagram illustrating an arrangement example (1) of the delay characteristic compensating circuit illustrated in FIG. 3 as a fourth embodiment of the present invention. According to the fourth embodiment, as illustrated in FIG. 6, the present invention has a configuration that the delay characteristic compensating circuit 4 illustrated in FIG. 3 is divided into the heat generating circuit 10 and the set of the temperature sensor 11, the voltage monitor 12, and the control circuit 13, a circuit block 21 in which the temperature sensor 11, the voltage monitor 12, and the control circuit 13 are arranged in a mass is placed at an arbitrary point in the chip of the logic area 2, a plurality of circuit blocks 23 of which each includes the heat generating circuit 10 are uniformly arranged in the logic area 2, and a control terminal 22 provided in the circuit block 21 and control terminals 24 provided in the circuit blocks 23 are connected to each other.

Figure 7:
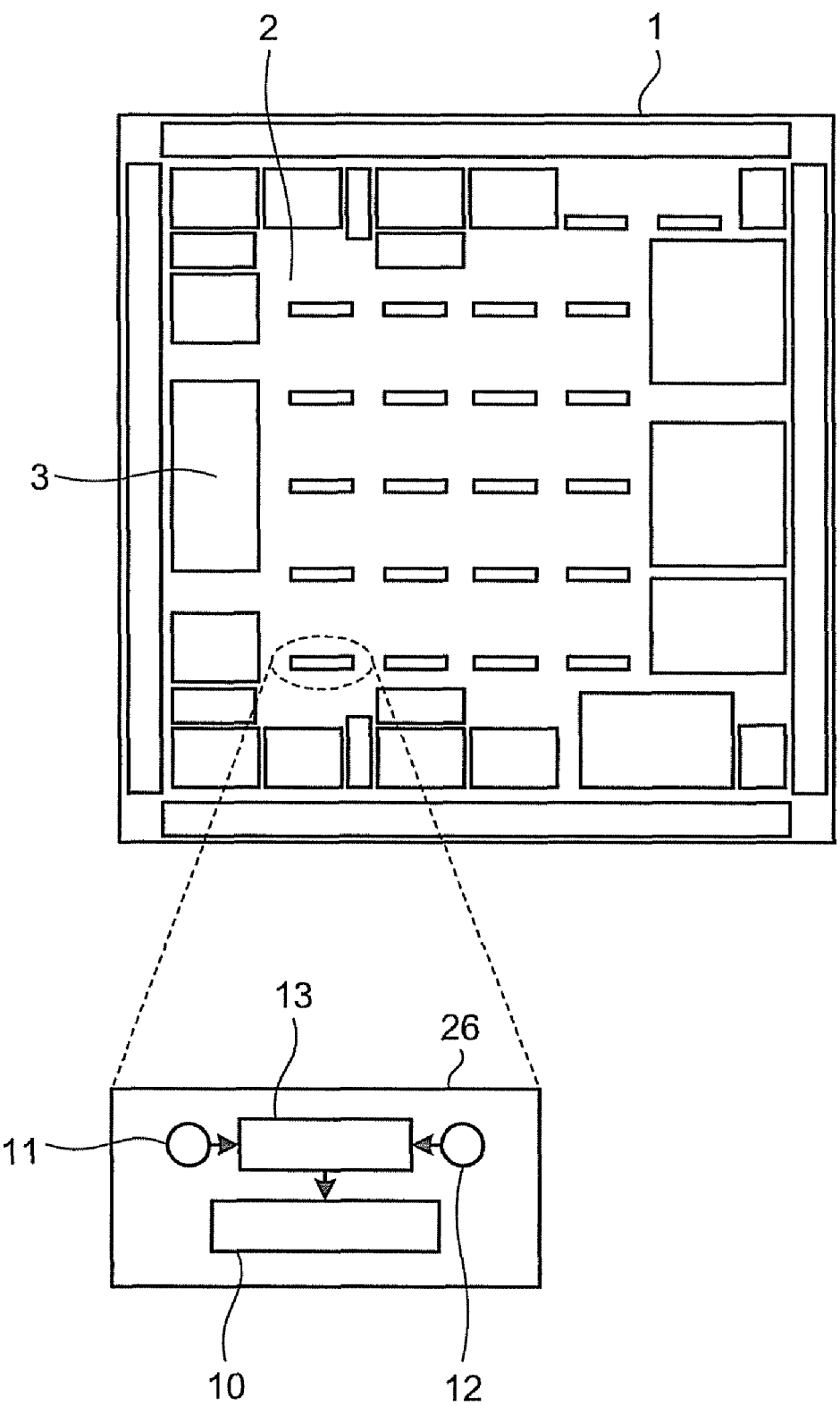
FIG. 7 is a circuit diagram illustrating an arrangement example (2) of the delay characteristic compensating circuit illustrated in FIG. 3 as a fifth embodiment of the present invention.

FIG. 7 is a circuit diagram illustrating an arrangement example (2) of the delay characteristic compensating circuit illustrated in FIG. 3 as a fifth embodiment of the present invention. According to the fifth embodiment, as illustrated in FIG. 7, the present invention has a configuration that the heat generating circuit 10, the temperature sensor 11, the voltage monitor 12, and the control circuit 13 constituting the delay characteristic compensating circuit 4 illustrated in FIG. 3 are arranged in a circuit block 26 in a mass and a plurality of circuit blocks 26 are uniformly arranged in the logic area 2.

Figure 8:
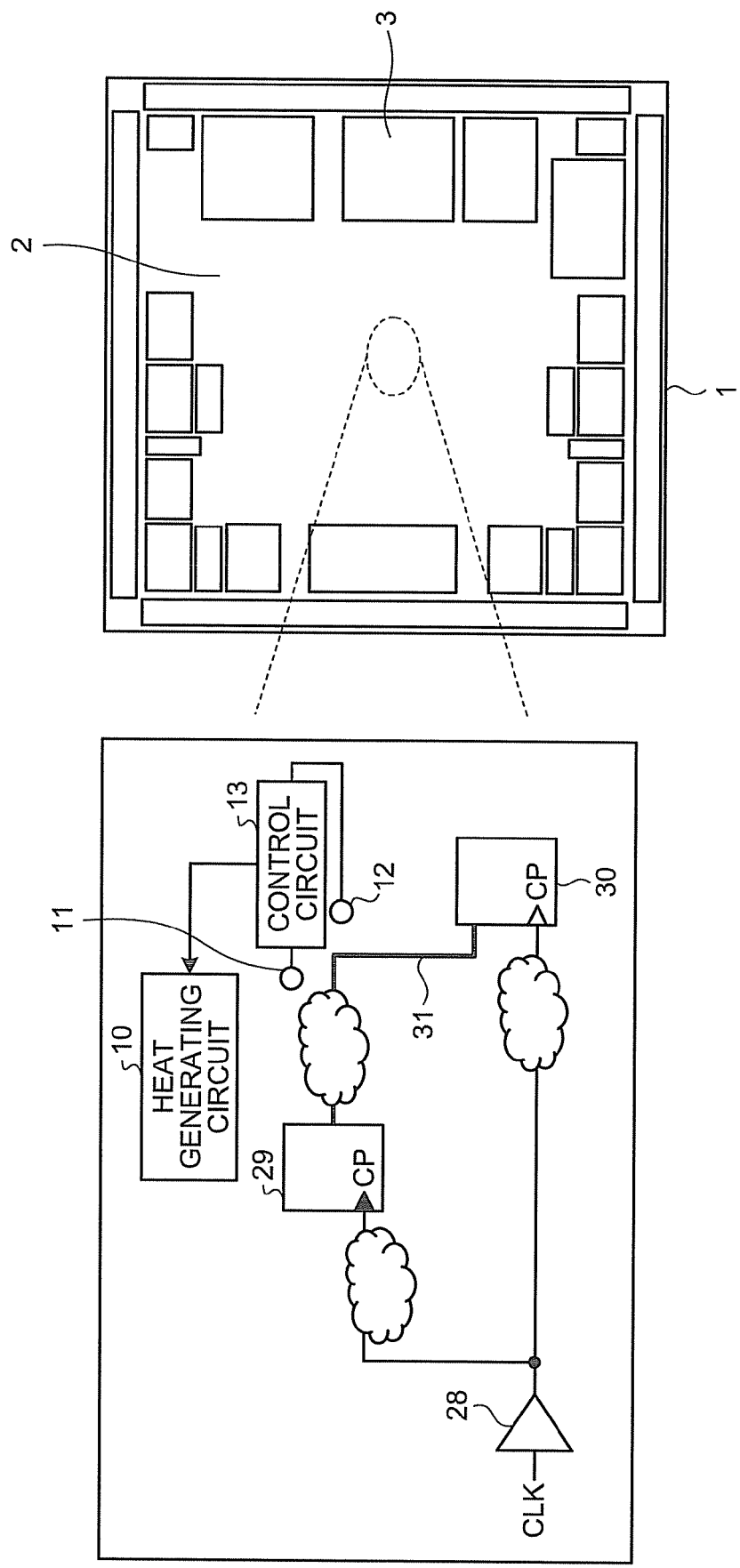
FIG. 8 is a circuit diagram illustrating an arrangement example (3) of the delay characteristic compensating circuit illustrated in FIG. 3 as a sixth embodiment of the present invention.

FIG. 8 is a circuit diagram illustrating an arrangement example (3) of the delay characteristic compensating circuit illustrated in FIG. 3 as a sixth embodiment of the present invention. According to the sixth embodiment, as illustrated in FIG. 8, the present invention has a configuration that when a data path 31 of which a timing to a clock CLK is critical is present between flip-flops 29 and 30 to which the clock CLK is supplied from a common buffer 28 at a certain place of the logic area 2, the heat generating circuit 10, the temperature sensor 11, the voltage monitor 12, and the control circuit 13 constituting the delay characteristic compensating circuit 4 illustrated in FIG. 3 are appropriately arranged in the vicinity of the critical data path 31 and a delay characteristic can be compensated and adjusted by heating the critical data path 31.

As described in the fourth to sixth embodiments, because the delay characteristic compensating circuit 4 illustrated in FIG. 3 can be incorporated into the chip, the heat generating circuit can be arranged in a range in which a delay characteristic at a low voltage and low temperature has a problem. Particularly, the heat generating circuit can be effectively arranged in the vicinity of a place having a problem and a delay characteristic can be effectively compensated under a situation where low temperature worst is easily generated. Moreover, like a conventional example, a cost effect is obtained compared with the case where the heat generating circuit is arranged on a chip surface.

Conventionally, for example, assuming that a circuit that can achieve 500 MHz when a design margin is 1.00 requires 1.15 as a design margin at a delay characteristic of a reference temperature, an achievable frequency becomes 434 MHz. However, if 1.25 is required as a design margin at a delay characteristic of a low temperature, the achievable frequency is decreased to 400 MHz. In this manner, when a low temperature worst phenomenon occurs, to perform timing verification by using an extremely large delay characteristic as compared to a reference temperature, a large design margin is required for timing verification at a reference temperature and thus a desired operating frequency cannot be achieved. Even if a desired operating frequency can be achieved, a square measure, a leakage, and a design turn-around time are increased for timing verification at a reference temperature.

In contrast, according to the present invention, when a low temperature worst phenomenon occurs at a low-voltage and low-temperature operation by using simulation, it is possible to avoid a timing design that is performed by using an extremely large delay characteristic as compared to a room temperature. Therefore, there can be expected various types of effects such as an effect of easily achieving a desired operating frequency in a product of which the specification is severe, a square-measure effect of achieving a desired operating frequency in a cell that has a smaller driving force, a leakage-current-reduction effect of achieving a desired operating frequency in a cell of which the circuit threshold is high, or an effect of shortening a design turn-around time due to easy timing compaction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
a delay characteristic compensating circuit that is provided in a logic area including an inside and a surface of a chip, and includes
a heat generating circuit that generates heat by using a self operation to heat the semiconductor integrated circuit,
a temperature sensor that measures a junction temperature,
a voltage monitor that measures a power supply voltage, and
a control circuit that determines whether the junction temperature reaches a reference temperature and whether the power supply voltage is lower than a reference voltage on the basis of signals output from the temperature sensor and the voltage monitor, does not actuate the heat generating circuit when the power supply voltage is higher than the reference voltage, actuates the heat generating circuit when the junction temperature does not reach the reference temperature and when the power supply voltage is lower than the reference voltage, and stops actuating the heat generating circuit when the junction temperature reaches the reference temperature.

2. The semiconductor integrated circuit according to claim 1, wherein
a circuit block in which the temperature sensor, the voltage monitor, and the control circuit are arranged in a mass is placed at an arbitrary one point in the chip in the logic area, and
a plurality of heat generating circuits are uniformly arranged in the logic area.

3. The semiconductor integrated circuit according to claim 1, wherein a plurality of circuit blocks in which the heat generating circuit, the temperature sensor, the voltage monitor, and the control circuit are arranged in a mass are uniformly arranged in the logic area.

4. The semiconductor integrated circuit according to claim 1, wherein the heat generating circuit, the temperature sensor, the voltage monitor, and the control circuit are arranged in the vicinity of a data path of which a timing to a clock is critical.

5. The semiconductor integrated circuit according to claim 1, wherein
the heat generating circuit is a SCAN test circuit that is already arranged for failure detection, and
the control circuit does not input a clock and data into the SCAN test circuit when the power supply voltage is higher than the reference voltage, inputs the clock and data into the SCAN test circuit to actuate the SCAN test circuit when the junction temperature does not reach the reference temperature and when the power supply voltage is lower than the reference voltage, and stops inputting the clock and data into the SCAN test circuit when the junction temperature reaches the reference temperature.

6. The semiconductor integrated circuit according to claim 1, wherein the heat generating circuit is a ring oscillator a start or a stop of which is controlled by an output of the control circuit.

7. The semiconductor integrated circuit according to claim 1, wherein the heat generating circuit is a ring oscillator in which a plurality of two-input NAND gates are connected in the shape of ring, in one two-input NAND gate, an output of the control circuit is input into one input terminal of the one two-input NAND gate and an output of a preceding-stage two-input NAND gate is input into another input terminal of the one two-input NAND gate, and in remaining two-input NAND gates, an output of a preceding-stage two-input NAND gate is input into one input terminal of the remaining two-input NAND gates and a power supply is connected to another input terminal of the remaining two-input NAND gates.

8. The semiconductor integrated circuit according to claim 1, wherein the heat generating circuit is a resistor a supply or a stop of which is controlled by an output of the control circuit.

9. The semiconductor integrated circuit according to claim 1, wherein the temperature sensor is configured with a series circuit composed of a transistor that is arranged between a power supply and a circuit ground and becomes a normal OFF operating state and a capacitor that is charged with leakage currents flowing into the transistor, and a series connection end configures an output terminal of the measured junction temperature.

10. The semiconductor integrated circuit according to claim 1, wherein the voltage monitor is a voltage comparator that compares the power supply voltage at an arrangement place and the reference voltage.

11. The semiconductor integrated circuit according to claim 1, wherein
the control circuit is configured with a NOR gate of which one input terminal is connected to an output terminal of the temperature sensor and another input terminal is connected to an output terminal of the voltage monitor, and
the reference temperature to the junction temperature measured by the temperature sensor is a level of a threshold voltage of the NOR gate.

12. A semiconductor integrated circuit comprising:
a clock generating circuit that generates a clock for delay characteristic compensation in response to a release of operation prohibition at non-test;
a data generating circuit that generates data for delay characteristic compensation in accordance with the clock for delay characteristic compensation in response to the release of operation prohibition at non-test;
a temperature sensor that measures a junction temperature;
a voltage monitor that measures a power supply voltage;
a control circuit that determines whether the junction temperature reaches a reference temperature and whether the power supply voltage is lower than a reference voltage on the basis of signals output from the temperature sensor and the voltage monitor, does not actuate the clock generating circuit when the power supply voltage is higher than the reference voltage, actuates the clock generating circuit when the junction temperature does not reach the reference temperature and when the power supply voltage is lower than the reference voltage, and stops actuating the clock generating circuit when the junction temperature reaches the reference temperature; and
a selector that is provided at an input side of a SCAN test circuit that is already arranged for failure detection and that selects a test clock and test data that are generated from an inside at test, selects the clock and data for delay characteristic compensation at non-test, and inputs the selected clock and data into the SCAN test circuit.

13. The semiconductor integrated circuit according to claim 12, wherein the clock generating circuit is a ring oscillator a start or a stop of which is controlled by an output of the control circuit.

14. The semiconductor integrated circuit according to claim 12, wherein the clock generating circuit is a ring oscillator in which a plurality of two-input NAND gates are connected in the shape of ring, in one two-input NAND gate, an output of the control circuit is input into one input terminal of the one two-input NAND gate and an output of a preceding-stage two-input NAND gate is input into another input terminal of the one two-input NAND gate, and in remaining two-input NAND gates, an output of a preceding-stage two-input NAND gate is input into one input terminal of the remaining two-input NAND gates and a power supply is connected to another input terminal of the remaining two-input NAND gates.

15. The semiconductor integrated circuit according to claim 12, wherein the data generating circuit is configured with a plurality of flip-flops that sequentially perform an operation of a data set in accordance with the clock for delay characteristic compensation and outputs the data for delay characteristic compensation from respective data output terminals thereof.

16. The semiconductor integrated circuit according to claim 12, wherein
the temperature sensor is configured with a series circuit composed of a transistor that is arranged between a power supply and a circuit ground and becomes a normal OFF operating state and a capacitor that is charged with leakage currents flowing into the transistor, and a series connection end configures an output terminal of the measured junction temperature.

17. The semiconductor integrated circuit according to claim 12, wherein the voltage monitor is a voltage comparator that compares the power supply voltage at an arrangement place and the reference voltage.

18. The semiconductor integrated circuit according to claim 12, wherein
the control circuit is configured with a NOR gate of which one input terminal is connected to an output terminal of the temperature sensor and another input terminal is connected to an output terminal of the voltage monitor, and
the reference temperature to the junction temperature measured by the temperature sensor is a level of a threshold voltage of the NOR gate.

* * * * *